(12) United States Patent
Driscoll et al.

(10) Patent No.: US 12,100,945 B2
(45) Date of Patent: *Sep. 24, 2024

(54) FREQUENCY-BASED DISTRIBUTED LOAD DISCONNECT

(71) Applicant: Itron, Inc., Liberty Lake, WA (US)

(72) Inventors: Timothy James Driscoll, Raleigh, NC (US); Gokulmuthu Narayanaswamy, Karnataka (IN)

(73) Assignee: Itron, Inc., Liberty Lake, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/230,259

(22) Filed: Aug. 4, 2023

(65) Prior Publication Data

US 2023/0378745 A1    Nov. 23, 2023

Related U.S. Application Data

(63) Continuation of application No. 17/709,110, filed on Mar. 30, 2022, now Pat. No. 11,799,286.

(51) Int. Cl.
*H02H 7/00* (2006.01)
*G01R 23/15* (2006.01)
*H02H 1/00* (2006.01)
*H02H 7/20* (2006.01)

(52) U.S. Cl.
CPC .............. *H02H 7/20* (2013.01); *G01R 23/15* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 4,563,650 A * | 1/1986 | York | H04L 27/2337 375/328 |
| 10,401,400 B2 | 9/2019 | Boudreau, Jr. et al. | |
| 11,799,286 B1 * | 10/2023 | Driscoll | H02H 1/0007 |
| 2007/0096769 A1 | 5/2007 | Shuey | |
| 2013/0123997 A1 | 5/2013 | King et al. | |
| 2013/0123998 A1 | 5/2013 | King et al. | |
| 2014/0246925 A1 * | 9/2014 | Porter | H02J 3/14 307/115 |

OTHER PUBLICATIONS

Office Action for U.S. Appl. No. 17/709,110, mailed on Mar. 28, 2023, Inventor #1 Timothy James Driscoll, "Frequency-Based Distributed Load Disconnect," 6 pages.

* cited by examiner

*Primary Examiner* — Stephen W Jackson
(74) *Attorney, Agent, or Firm* — Lee & Hayes, P.C.

(57) ABSTRACT

A method, apparatus, and system for disconnecting loads from the electrical grid based on a power line frequency are disclosed. An electricity meter may monitor a power line frequency of a source power line connected to the electricity meter, and in response to determining that the power line frequency is lower than a disconnect threshold frequency, may open an internal switch and disconnect a load side output of the electricity meter from the source power line.

20 Claims, 8 Drawing Sheets

FREQUENCY-BASED DISTRIBUTED LOAD DISCONNECT

CROSS-REFERENCE TO RELATED APPLICATIONS

This application is a continuation of and claims priority to U.S. patent application Ser. No. 17/709,110, filed Mar. 30, 2022, which is incorporated by reference herein.

TECHNICAL FIELD

The present disclosure generally relates to the field of electrical load management, and more specifically to methods, devices, and systems for disconnecting and re-connecting loads through an electricity meter to an electrical power grid based on a frequency of a power line.

BACKGROUND

A utility provider may perform load shedding by disconnecting services to some customers to prevent the electricity distribution system, or the grid, from being overloaded. The utility provider may also perform load shedding when demand for electrical power exceeds, or is expected to exceed, the available power, i.e., the demand is greater than the amount of power the generator is able to produce. During the load shedding, electricity to specific power lines, or a specific section of the electrical grid, which provide electricity to a group of customers' homes and businesses, may be turned off while maintaining electricity to critical services, such as hospitals, fire and police departments, and the like.

As the electricity distribution system, i.e., the grid, becomes overloaded, the power line frequency of the supplied power decreases from the normal frequency, for example, 60 Hz, and may lead to instability in the grid. Load shedding is a last resort to maintain the integrity of the grid. Load shedding will cause inconvenience to the customers but may be necessary to prevent catastrophic grid failure which may lead to a longer power outage.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

A method, apparatus, and system for disconnecting loads from the electrical grid based on a power line frequency are disclosed. The power line frequency may be a voltage or current frequency of the source power line from a utility provider that provides electricity to premises through an electricity meter and is measured, or monitored, at the electricity meter.

Figure 1:
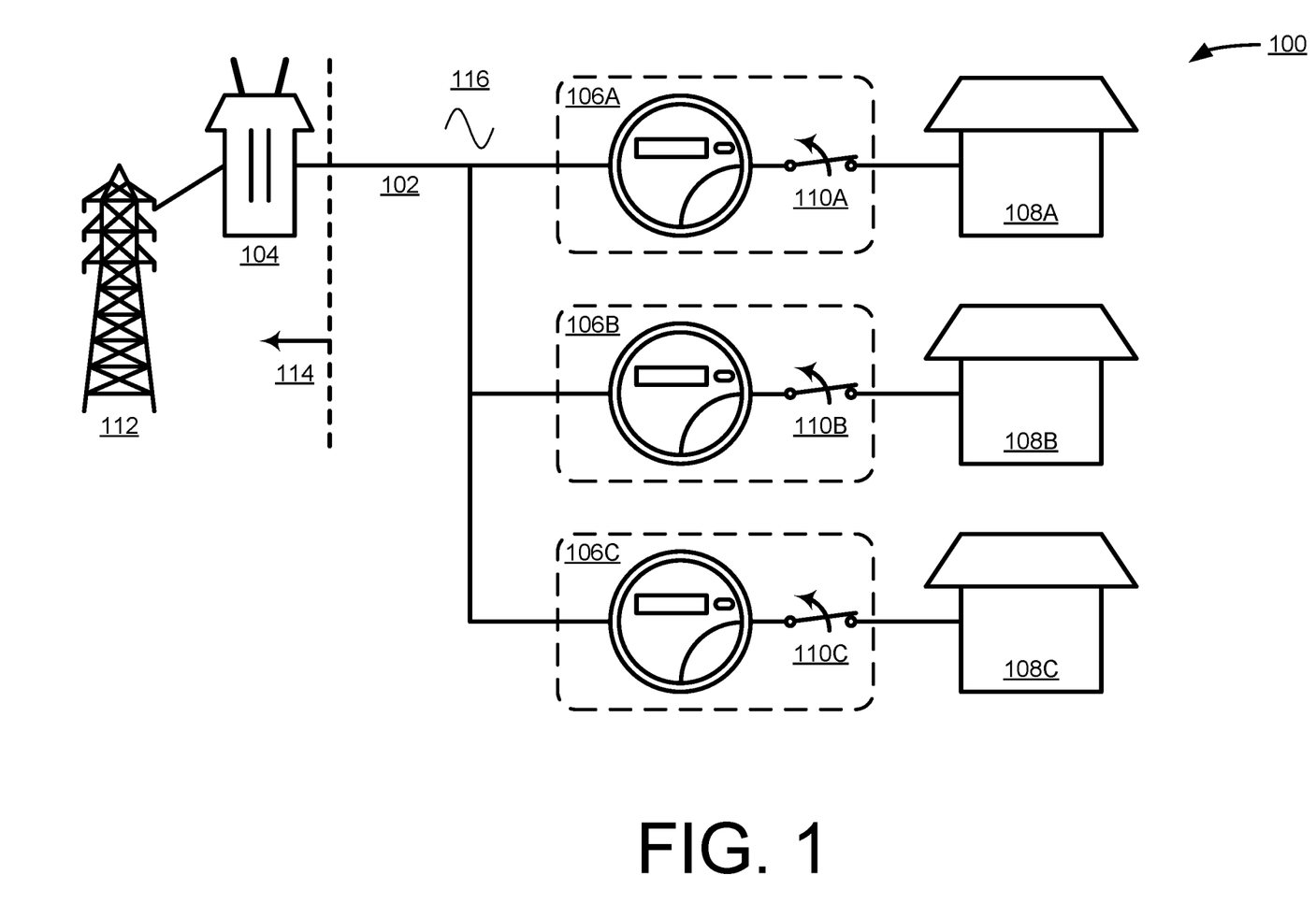
FIG. 1 illustrates an example environment in which a frequency-based distributed load disconnect system may be utilized.

FIG. 1 illustrates an example environment 100 in which a frequency-based distributed load disconnect system may be utilized. In this example, a power line 102 from a transformer 104 is shown to be connected to a plurality of electricity meters 106, which may be smart meters, through which electricity is provided to associated premises 108. Three electricity meters, 106A, 106B, and 106C, are shown to provide electricity to the premises, 108A, 108B, and 108C, respectively, for powering various electric devices in the premises 108. The electricity meter 106 may comprise an internal switch 110 (shown in a closed/connected position outside of the electricity meter housing for clarity) which is capable of disconnecting electricity supplied to the load side output of the electricity meter 106 which connects, and supplies electricity, to the premises 108. In this example, the transformer 104 is shown to be connected to a transmission tower 112 and represents a portion of the electrical power grid 114 which comprises power stations, sub-stations, transmission lines, and other electric distribution components (not shown).

Under a normal condition when the grid is not overloaded, a power line frequency 116 stays at a normal power line frequency, for example, at 60 Hz. However, as the demand for electrical power increases and begins to exceed the available power, the grid begins to be overloaded and the power line frequency 116 begins to drop below the normal frequency. The demand may exceed the available power due to a number of reasons, such as many consumers simultaneously charging Electric Vehicles and severe weather conditions in which a large number of consumers continuously use heating or cooling equipment. The demand may also exceed the available power if one or more power generators go offline or some transmission lines become disconnected and fail to provide power from the generators to some parts of the grid. As the demand continues to increase while the available power remains the same, the grid becomes overloaded and the power line frequency 116 decreases from the normal frequency of 60 Hz. Accordingly, the decrease in the power line frequency 116 from the normal frequency of 60 Hz is an indicator of a severe grid overload, which may lead to instability in the grid 114 and cause a catastrophic grid failure.

To maintain the integrity of the grid 114 and avoid a catastrophic grid failure, the demand needs to be reduced, which may be accomplished by load shedding, i.e., disconnecting the service to some customers. Instead of disconnecting the service to a large area, which may comprise multiple regions, in a single disconnect, electricity meters of individual premises and buildings may be utilized to accomplish the load shedding. The electricity meter 106 may monitor the power line frequency 116 of the power line 102, and when power line frequency 116 falls below a threshold frequency, open the internal switch 110 to disconnect the load side output of the electricity meter 106 from the grid 114 and disconnect the service to the premises 108. The electricity meter 106 may disconnect the load side output of the electricity meter 106 from the grid 114 in response to determining that the power line frequency 116 has remained lower than the threshold frequency for at least a predetermined disconnect time period (e.g., the measured voltage frequency has been lower than the threshold voltage frequency for at least a threshold period time).

Figure 2:
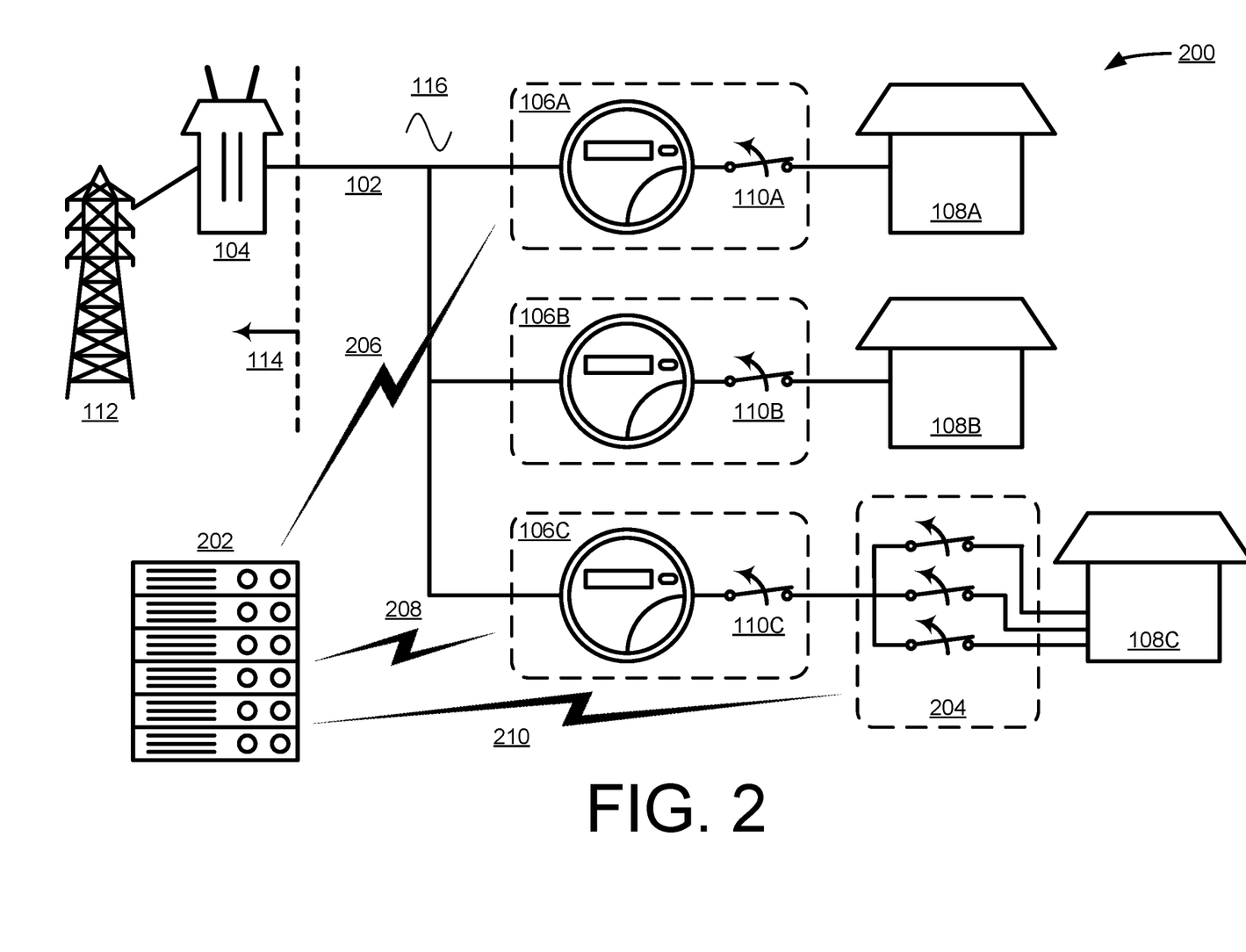
FIG. 2 illustrates an example environment in which a control center and a load control switch are additionally utilized in the example environment of FIG. 1.

FIG. 2 illustrates an example environment 200 in which a control center 202 and a load control switch 204 are additionally utilized in the example environment 100 of FIG. 1.

Additionally, or alternatively, the electricity meter 106 may notify the control center 202 regarding the power line frequency 116. For example, the electricity meter 106A may communicate the current frequency of the power line frequency 116 with the control center 202. Alternatively, the electricity meter 106A may notify the control center 202 when the power line frequency 116 falls, and stays for the predetermined disconnect time period, below the threshold frequency. In this example, the electricity meter 106A is illustrated to directly communicate with control center 202 wirelessly, as shown by arrow 206. However, the communications between the electricity meter 106A and the control center 202 may be established in various ways, such as via a cellular network, Wi-Fi network, cable network, landline telephone network, the internet, and the like. In response to receiving the status of the power line frequency 116 falling below the threshold frequency from the electricity meter 106A, the control center 202 may send instructions to the electricity meter 106A to open the internal switch 110A to disconnect the electrical service to the premises 108A.

Additionally, or alternatively, the electricity meter 106 may be connected to the premises 108 through the load control switch 204. The control center 202, in response to receiving the status of the power line frequency 116 falling below the threshold frequency from the electricity meter 106C as shown by arrow 208, may send instructions to the load control switch 204, as shown by arrow 210, to control one or more switches of the load control switch 204. For example, a first switch of the load control switch 204 may be connected to an HVAC system of the premises 108C and draws the most current, a second switch the load control switch 204 may be connected to a washer and a dryer, and the like. The instructions from the control center 202 may specify which switch(es) of the load control switch 204 to disconnect. Alternatively, the control center 202 may send instructions to control the load control switch 204 to the electricity meter 106C, and the electricity meter 106C may manage the switches of the load control switch 204 based on the instructions from the control center 202.

The load control switch 204 may alternatively be an intelligent load control switch capable of monitoring the voltage frequency 116 and controlling one or more switches of the load control switch 204 based on the voltage frequency 116. The intelligent load control switch may be configured with different disconnect and reconnect threshold frequencies and different shut-off and reconnect test time intervals for each circuit that one or more switches of the intelligent load control switch controls. These configurations for the intelligent load control switch may be remotely set or changed by the control center 202 anytime.

Figure 3:
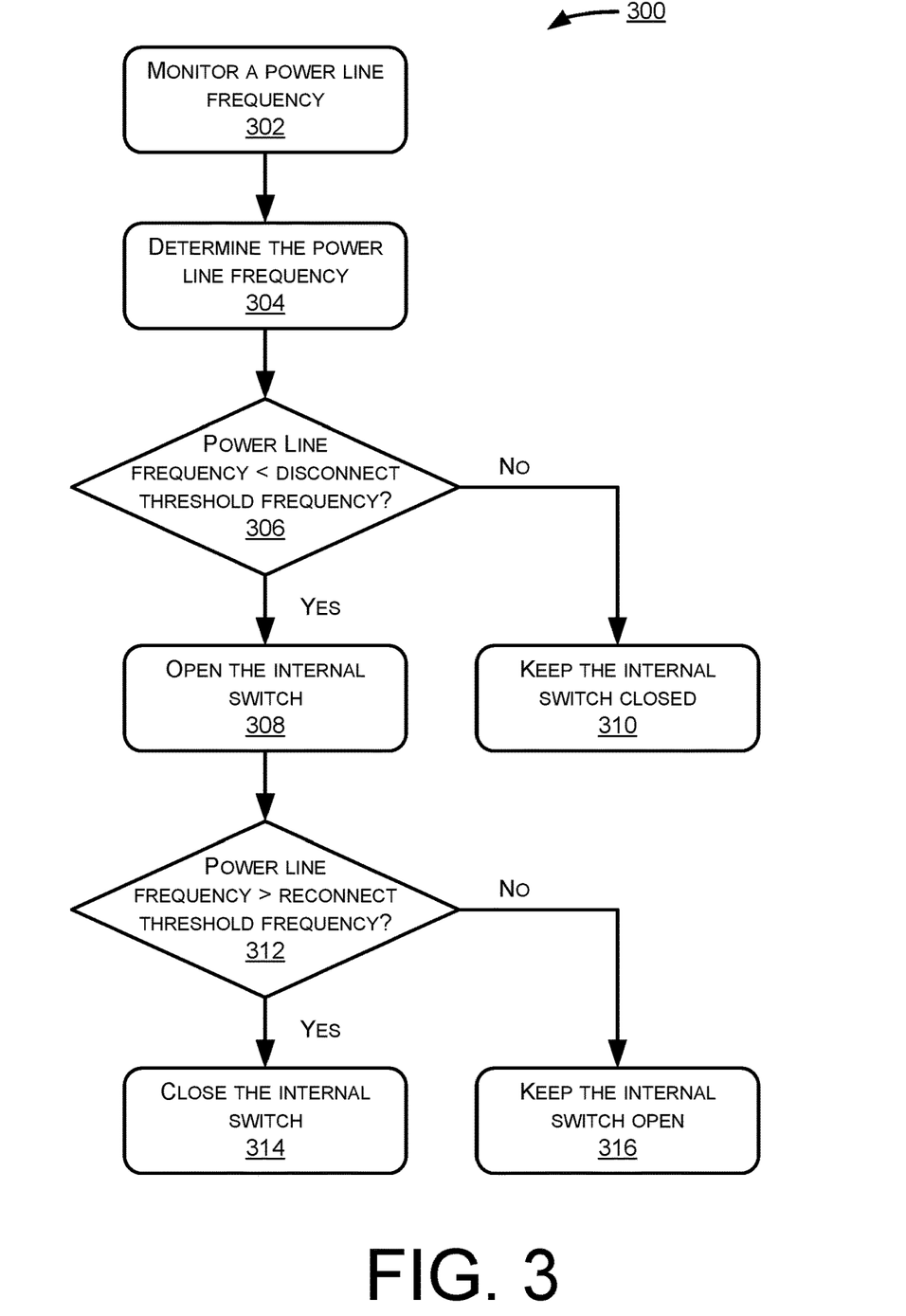
FIG. 3 illustrates an example process for disconnecting loads from the grid based on power line frequency.

FIG. 3 illustrates an example process 300 for disconnecting loads from the grid 114 based on the power line frequency 116.

At block 302, a power line frequency is monitored. In the example of FIG. 1, an electricity meter, such as the electricity meter 106, may monitor a power line frequency 116 of a source power line 102 connected to the electricity meter 116 where the source power line 102 is coupled to a load side output, i.e., the internal switch 110, of the electricity meter 106 and provides electricity to the associated premises 108 as described with reference to FIG. 1. At block 304, the power line frequency is determined. In the example of FIG. 1, the electricity meter 106 may determine the power line frequency 116, and may determine whether the power line frequency 116 is lower than a disconnect threshold frequency at block 306. As described above, a decrease in the power line frequency 116 from the normal frequency of 60 Hz is an indicator of a severe grid overload, and the disconnect threshold frequency may be preset at a certain level lower than the normal frequency, for example at 59.0 Hz. If the power line frequency 116 is determined to be lower than, or equal to, the disconnect threshold frequency at block 306, the electricity meter 106 may open the internal switch 110 and disconnect the load side output powering the premises 108 from the source power line 102, or the grid 114 at block 308. The power line frequency 116 may be determined to be lower than, or equal to, the disconnect threshold frequency when the power line frequency 116 has remained lower than, or equal to, the disconnect threshold frequency for a predetermined disconnect time period, such as one second. However, if the power line frequency 116 remains above the disconnect threshold frequency, the electricity meter 106 may take no action at block 310, and the internal switch 110 may remain closed and continue providing electricity to the premises 108.

The disconnect threshold frequency referenced above may be one of a plurality of disconnect threshold frequencies. Because a decrease in the power line frequency 116 from the normal frequency is an indicator of a severe grid overload, an amount of the decrease in the line frequency 116 may indicate the severity of the grid overload, that is, the lower the power line frequency 116, the more severe the grid overload. For example, three disconnect threshold frequencies, f1=59.3 Hz, f2=59.0 Hz, and f3=58.7 Hz, may be preselected representing relative severity of the grid overload where f3 being the most severe and f1 being the least severe. Configurations for the threshold frequencies may be remotely set or changed by the control center 202 anytime, for example, the disconnect threshold frequencies may be set to frequencies other than those discussed above and a number of the disconnect threshold frequencies, or disconnect levels, may be set to a number other than three as discussed above.

Different groups of premises, or loads, may then be associated with different disconnect threshold frequencies such that appropriate group(s) may be disconnected, or shed, based on the severity of the grid overload. For example, Group 1 of premises may be associated with f1, Group 2 with f2, and Group 3 with f3 where each group comprises appropriate number of houses, businesses, buildings, and the like. When the power line frequency 116 falls and reaches f1, Group 1 may be shed. If the power line frequency 116 continues to fall after shedding Group 1 and reaches f2, then Group 2 may also be shed. If the power line frequency 116 still continues to fall and reaches f3 after shedding Groups 1 and 2, then Group 3 may also be shed. An order of shedding priority may also be assigned to sub-groups within each group.

After the electricity meter 106 opens the internal switch 110 and disconnects the load side output at block 308, the electricity meter 106 may continue to monitor and determine the power line frequency 116, and determine whether the power line frequency 116 is higher than a reconnect threshold frequency at block 312. The reconnect threshold frequency is higher than the disconnect threshold frequency. For example, if the disconnect threshold frequency were set at f2=59.0 Hz, the corresponding reconnect threshold frequency may be set at 59.2 Hz, which is higher than f2 but is lower than the next disconnect threshold frequency, f1=59.3 Hz. If the power line frequency 116 is determined to be higher than the reconnect threshold frequency at block 312, the electricity meter 106 may close the internal switch 110 and reconnect the load side output powering the premises 108 to the source power line 102, or the grid 114 at block 314. The power line frequency 116 may be determined to be higher than the reconnect threshold frequency when the power line frequency 116 has remained higher than the reconnect threshold frequency for a predetermined disconnect time period, such as 60 seconds. If the power line frequency 116 remains lower than, or equal to, the reconnect threshold frequency, the electricity meter 106 may take no action at block 316, and the internal switch 110 may remain open.

Figure 4:
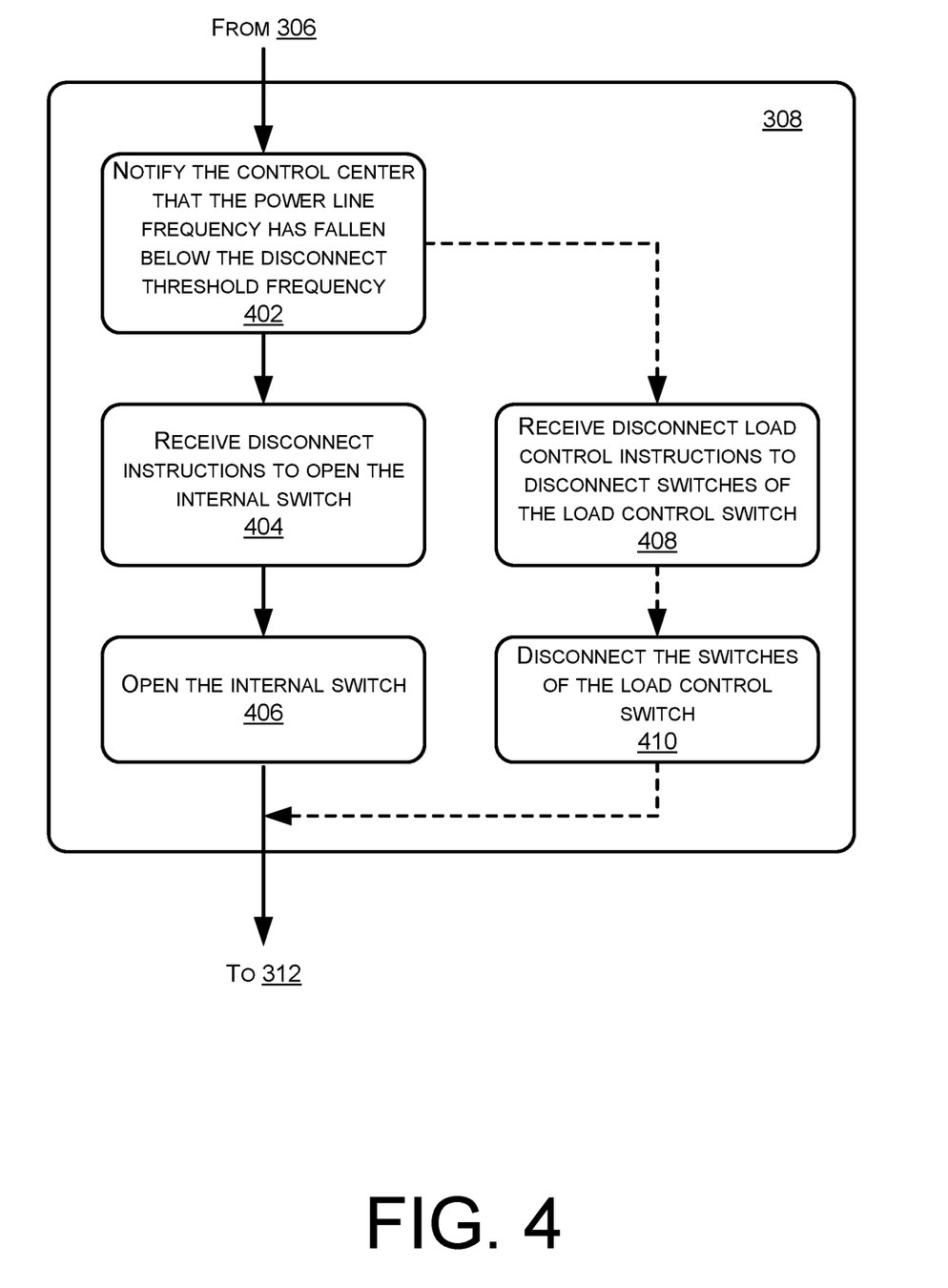
FIG. 4 illustrates an example process for disconnecting loads in which a control center and a load control switch are additionally utilized.

FIG. 4 illustrates an example process detailing block 308 for disconnecting loads in which a control center 202 and a load control switch 204 are additionally utilized.

Upon determining that the power line frequency 116 is lower than, or equal to, the disconnect threshold frequency at block 306, the electricity meter 106 may notify the control center 202 that the power line frequency 116 has fallen below the disconnect threshold frequency at block 402 as described with reference to FIG. 2. In response, the control center 202 may send to the electricity meter 106 disconnect instructions to disconnect the load side output from the source power line, and at block 404, the electricity meter 106 may receive the disconnect instructions. At block 406, the electricity meter 106 may open the internal switch 110 and disconnect the load side output powering the premises 108 from the source power line 102, or the grid 114. As described with reference to FIG. 2, the communications between the electricity meter 106 and the control center 202 may be established in various ways, such as via a cellular network, Wi-Fi network, cable network, landline telephone network, the internet, etc.

Additionally, or alternatively, the electricity meter 106 may be connected to the premises 108 through the load control switch 204 as described with reference to FIG. 2. In response to receiving the status of the power line frequency 116 falling below the disconnect threshold frequency from the electricity meter 106, the control center 202 may send to the electricity meter 106 disconnect load control instructions to control the load control switch 204. At block 408, the electricity meter 106 may receive the disconnect load control instructions from the control center 202, and may disconnect one or more switches of the load control switch 204 based on the disconnect load control instructions from the control center 202 at block 410. For example, a first switch of the load control switch 204 may be connected to an HVAC system of the premises 108 and draws the most current, a second switch the load control switch 204 may be connected to a washer and a dryer, or other appliance(s), etc. The disconnect load control instructions from the control center 202 may specify which switch(es) of the load control switch 204 to disconnect. Alternatively, the control center 202 may send the disconnect load control instructions directly to the load control switch 204 to disconnect one or more switches of the load control switch 204.

Figure 5:
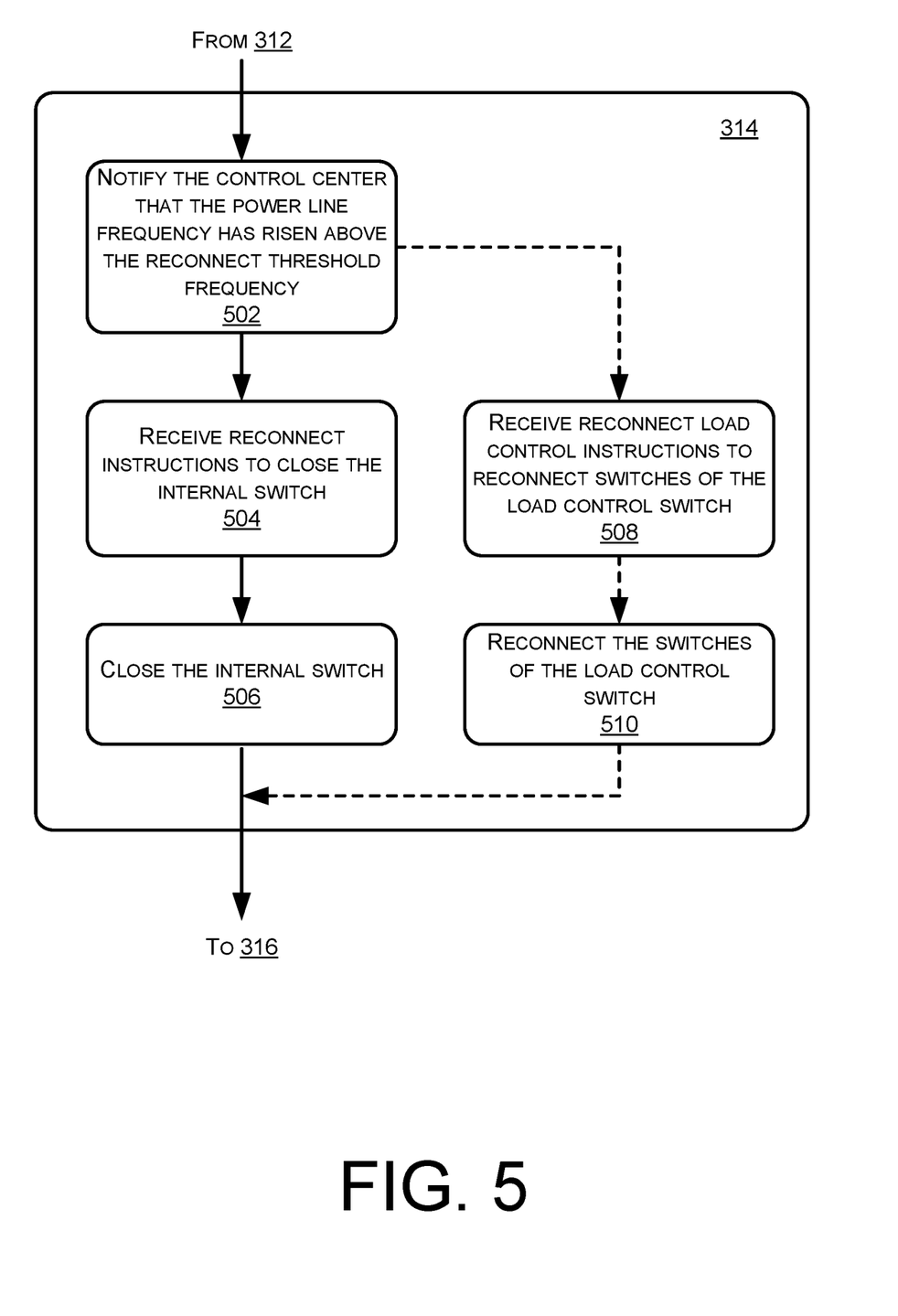
FIG. 5 illustrates an example process for reconnecting load(s) in which the control center and the load control switch are additionally utilized.

FIG. 5 illustrates an example process detailing block 314 for reconnecting load(s) in which the control center 202 and the load control switch 204 are additionally utilized.

Upon determining that the power line frequency 116 has increased above the reconnect threshold frequency at block 312, the electricity meter 106 may notify the control center 202 that the power line frequency 116 has increased above the reconnect threshold frequency at block 502 as described with reference to FIG. 2. In response, the control center 202 may send to the electricity meter 106 reconnect instructions to the source power line, and at block 504, the electricity meter 106 may receive the reconnect instructions. At block 506, the electricity meter 106 may close the internal switch 110 and reconnect the load side output powering the premises 108 to the source power line 102, or the grid 114. As described with reference to FIG. 2, the communications between the electricity meter 106 and the control center 202 may be established in various ways, such as via a cellular network, Wi-Fi network, cable network, landline telephone network, the internet, and the like.

Additionally, or alternatively, the electricity meter 106 may be connected to the premises 108 through the load control switch 204 as described with reference to FIG. 2. In response to receiving the status of the power line frequency 116 rising above the reconnect threshold frequency from the electricity meter 106, the control center 202 may send to the electricity meter 106 reconnect load control instructions to control the load control switch 204. At block 508, the electricity meter 106 may receive the reconnect load control instructions from the control center 202, and may reconnect one or more switches of the load control switch 204 based on the reconnect load control instructions from the control center 202 at block 510. The reconnect load control instructions from the control center 202 may specify which switch(es) of the load control switch 204 to reconnect. Alternatively, the control center 202 may send the reconnect load control instructions directly to the load control switch 204 to reconnect one or more switches of the load control switch 204.

Figure 6:
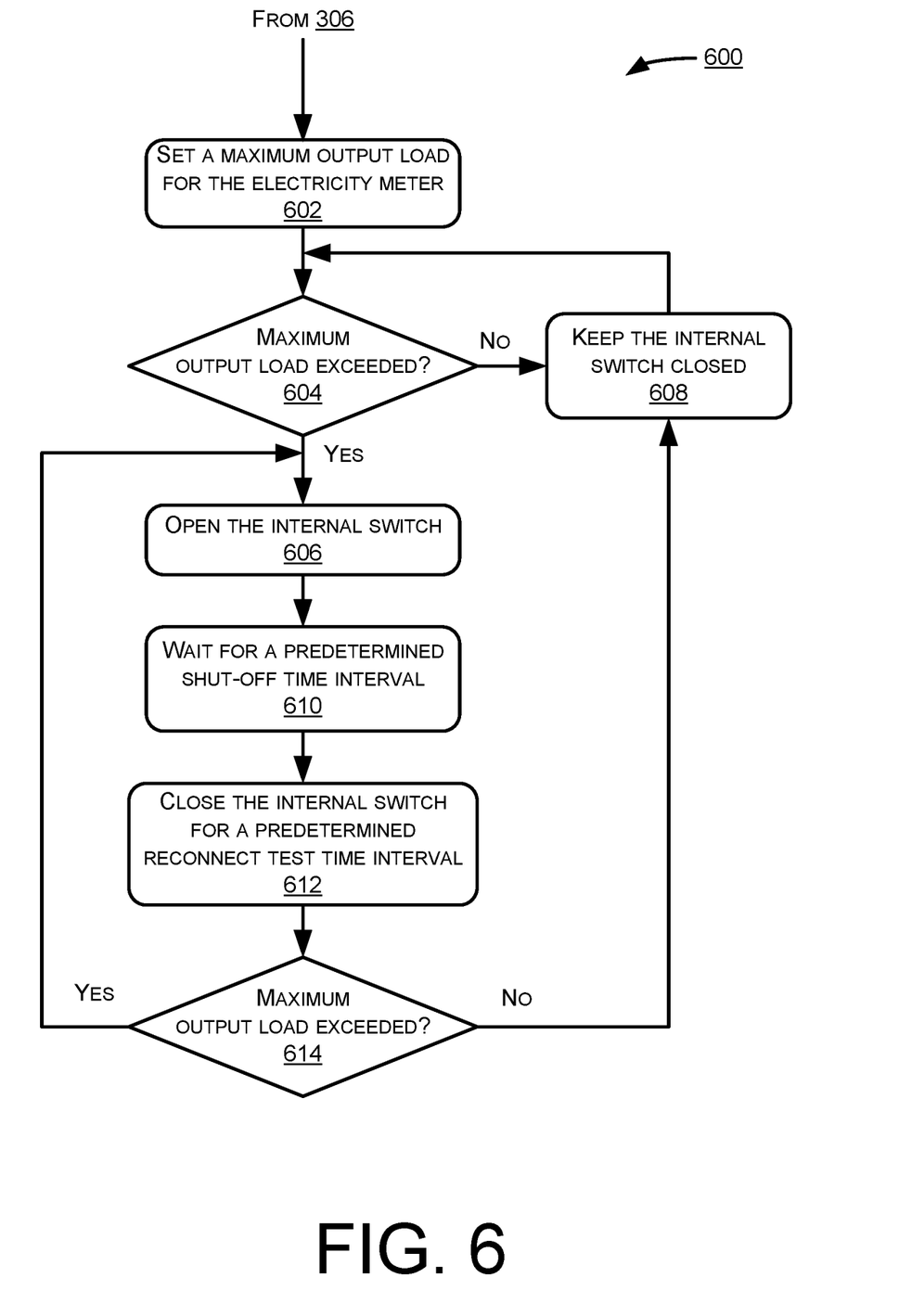
FIG. 6 illustrates an example alternative process for disconnecting loads from the grid based on the power line frequency.

FIG. 6 illustrates an example alternative process 600 for disconnecting loads from the grid based on the power line frequency.

Upon determining that the power line frequency 116 is lower than, or equal to, the disconnect threshold frequency at block 306, the electricity meter 106 may set a maximum output load for the electricity meter 106 at block 602 where the maximum output load is lower than a normal output load when the power line frequency is above the disconnect threshold frequency. At block 604, the electricity meter 106 may determine whether the maximum output load is exceeded. If the electricity meter 116 determines that the maximum output load is exceeded at block 604, the electricity meter 106 may open the internal switch 110 and disconnect the load side output powering the premises 108 from the source power line 102, or the grid 114 at block 606. However, as long as the maximum output load is not exceeded at block 604, the electricity meter 106 may maintain the internal switch 110 closed at block 608, and the process may loop back to block 604 to continuously or periodically determine whether the maximum output load is exceeded.

After the electricity meter 106 opens the internal switch 110 and disconnects the load side output at block 606, the electricity meter 106 may wait, at block 610, for a predetermined shut-off time interval, for example, for 60 seconds from the time when the internal switch 110 was opened at block 606 disconnecting the load side output from the source power line 102. The electricity meter 106 may then close the internal switch 110 for a predetermined reconnect test time interval reconnecting the load side output to the source power line 102 at block 612, and determine whether the maximum load is exceeded during the predetermined reconnect test time interval at block 614. The predetermined shut-off time interval and the predetermined reconnect test time interval may be selected randomly from a range of time intervals to avoid all premises from being disconnected or re-connected at the same time.

In response to determining that the maximum load is not exceeded during the predetermined reconnect test time interval at block 614, the electricity meter 106 may keep the internal switch closed at block 608 and maintain the reconnection of the load side output to the source power line 102. However, if the electricity meter 106 determines that the maximum load is exceeded during the predetermined reconnect test time interval, the process loops back to block 606 and the electricity meter 106 opens the internal switch 110 and disconnects the load side output. The process 600 may continue to run while the power line frequency 116 is determined to be below the disconnect threshold frequency as determined in block 306, and may terminate once the power line frequency is determined to have increased above the reconnect threshold frequency as determined at block 312 and the electricity meter 106 resets the output load to the normal output load.

Figure 7:
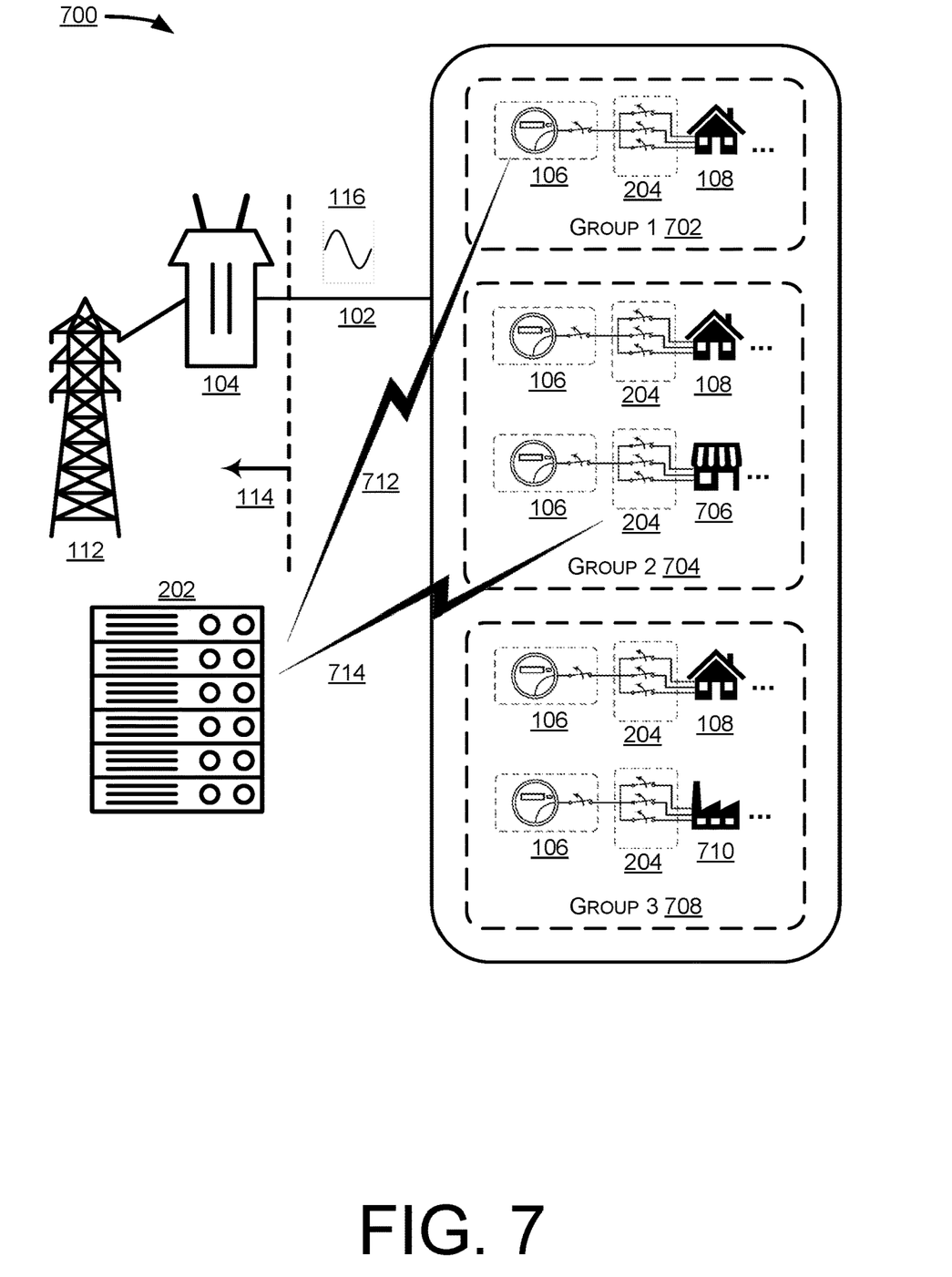
FIG. 7 illustrates example environment in which groupings of premises are associated with different disconnect threshold frequencies.

FIG. 7 illustrates example environment 700 in which groupings of premises are associated with different disconnect threshold frequencies.

Different groups of premises, or loads, may be associated with different disconnect threshold frequencies as discussed above with reference to FIG. 3 such that appropriate group(s) may be disconnected, or shed, based on the severity of the grid overload. For example, three disconnect threshold frequencies, f1=59.3 Hz, f2=59.0 Hz, and f3=58.7 Hz, may be preselected representing relative severity of the grid overload where f3 being the most severe and f1 being the least severe. Group 1 702, comprising a first 1,000 residential premises 106, may be associated with f1, Group 2 704, comprising a second 1000 residential premises 106 and 100 businesses 706, may be associated with f2, and Group 3 708, comprising a third 1000 residential premises 106 and three factories 710, may be associated with B. When the power line frequency 116 falls and reaches f1, Group 1 702 may be shed decreasing demand on the electrical power grid 114, thereby allowing the power line frequency 116 to recover towards the normal frequency of 60 Hz.

However, if the power line frequency 116 continues to fall after shedding Group 1 702 and reaches f2, then Group 2 704 may also be shed. If the power line frequency 116 still continues to fall and reaches f3 after shedding Group 1 702 and Group 2 704, then Group 3 708 may also be shed. An order of shedding priority may also be assigned to subgroups within each group.

Instructions to shed may be sent from the control center 202 to the electricity meters 106 (shown as arrow 712) or the load control switch 204 (shown as arrow 714) of the premises of each Group upon the power line frequency 116 reaching the corresponding disconnect threshold frequency. Alternatively, if the load control switches 204 were intelligent load control switches, then each intelligent load control switch may monitor the voltage frequency 116 and disconnect specific loads within the premises upon determining that the power line frequency 116 has reach the disconnect threshold frequency associated with the specific loads the premises.

Figure 8:
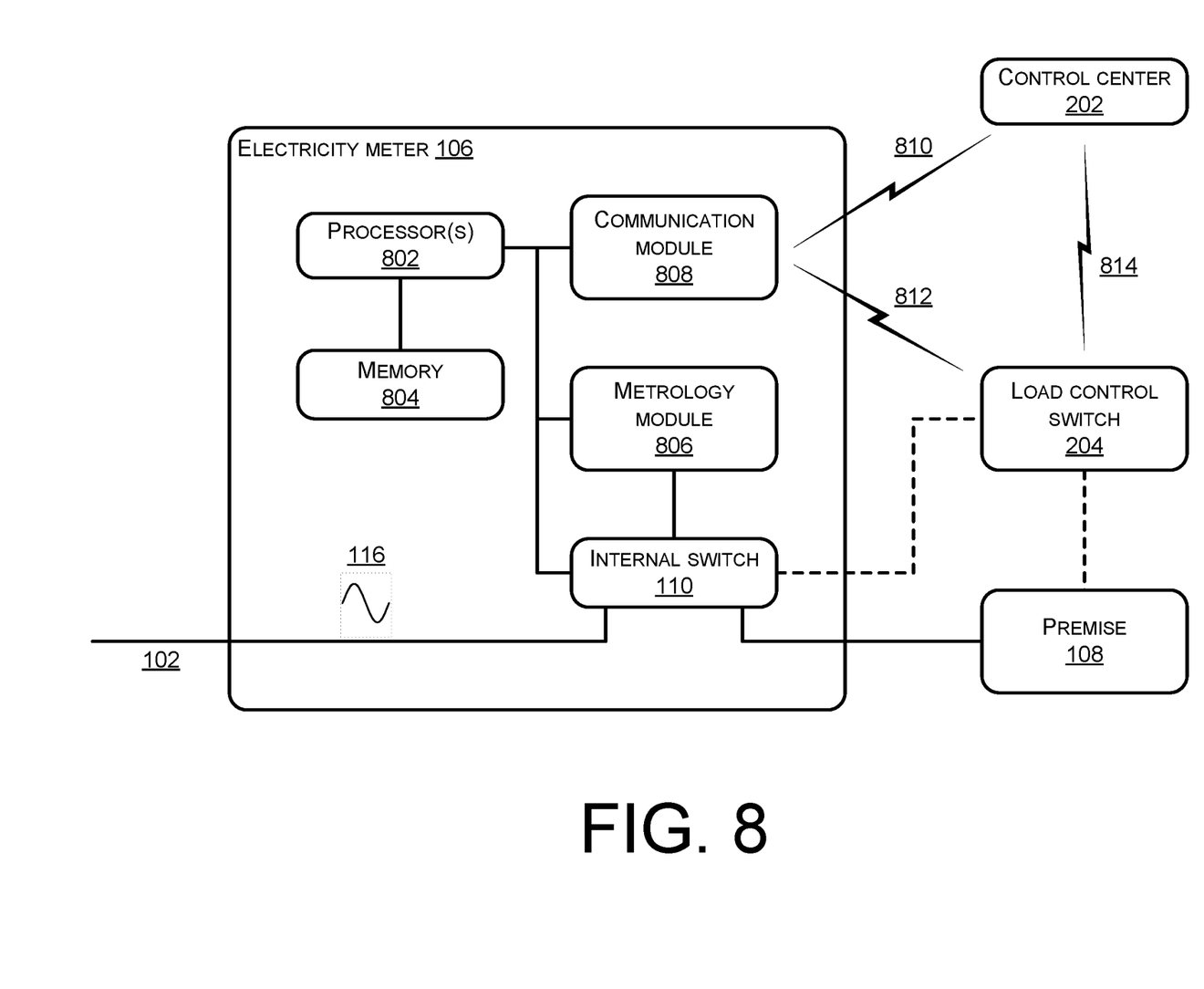
FIG. 8 illustrates an example block diagram of an electricity meter.

FIG. 8 illustrates an example block diagram of the electricity meter 106.

The electricity meter 106 may comprise one or more processors (e.g., processors 802) communicatively coupled to memory 804. The processors 802 may include one or more central processing units (CPUs), graphics processing units (GPUs), both CPUs and GPUs, or other processing units or components known in the art. The processors 802 may execute computer-executable instructions stored in the memory 804 to perform functions or operations with one or more of components communicatively coupled to the one or more processors 802 and the memory 804 as described above with reference to FIGS. 1-7. Depending on the exact configuration of the electricity meter 106, the memory 804 may be volatile, such as RAM, non-volatile, such as ROM, flash memory, miniature hard drive, memory card, and the like, or some combination thereof. The memory 804 may store computer-executable instructions that are executable by the processors 802.

The components of the electricity meter 106 coupled to the processors 802 and the memory 804 may comprise a metrology module 806, an internal switch 110, and a communication module 808. The metrology module 806 may be capable of measuring voltage, current, power consumption, power line frequency, and the like associated with the power line 102 and the premises 108 connected to the electricity meter 106. The internal switch 110 may connect and disconnect electricity from the source power line 102 to the premises 108. The communication module 808 may communicate with the control center 202 information regarding the power line frequency 116 and the load control switch 204. As discussed above with reference to FIG. 2, the load control switch 204 may be an intelligent load control switch capable of monitoring the voltage frequency 116 and controlling one or more switches of the load control switch 204 based on the voltage frequency 116.

As discussed above, with reference to FIGS. 1-7, the electricity meter 106 may monitor a power line frequency 116 of a source power line 102 connected to the electricity meter 106 using the metrology module 806. The source power line 102 may be coupled via the internal switch 110 to a load side output of the electricity meter 106 that connects to the premises 108. Alternatively, the load control switch 204 may be placed between the internal switch 110 and the premises 108 as shown by dotted lines. The metrology module 806 may determine the power line frequency 116, and may determine whether the power line frequency 116 is lower than a disconnect threshold frequency. If the metrology module 806 determines that the power line frequency 116 is lower than, or equal to, the disconnect threshold frequency, for example 59.0 Hz, the electricity meter 106 may open the internal switch 110 and disconnect the load side output powering the premises 108 from the source power line 102, or the grid 114. The metrology module 806 may determine the power line frequency 116 to be lower than, or equal to, the disconnect threshold frequency when the power line frequency 116 has remained lower than, or equal to, the disconnect threshold frequency for a predetermined disconnect time period, such as one second. However, if the power line frequency 116 remains above the disconnect threshold frequency, the electricity meter 106 may take no action, and the internal switch 110 may remain closed and continue providing electricity to the premises 108.

After the electricity meter 106 opens the internal switch 110 and disconnects the load side output, the metrology module 806 may continue to monitor and determine the power line frequency 116, and determine whether the power line frequency 116 is higher than a reconnect threshold frequency as described above with reference to FIG. 3. If the metrology module 806 determines the power line frequency 116 to be higher than the reconnect threshold frequency, the electricity meter 106 may close the internal switch 110 and reconnect the load side output powering the premises 108 to the source power line 102, or the grid 114. If the power line frequency 116 remains lower than, or equal to, the reconnect threshold frequency, the electricity meter 106 may take no action, and the internal switch 110 may remain open.

Additionally, or alternatively, the electricity meter 106 may notify the control center 202 via the communication module 808 that the power line frequency 116 has fallen below the disconnect threshold frequency. In response, the control center 202 may send to the electricity meter 106 disconnect instructions to disconnect the load side output from the source power line, and the electricity meter 106 may receive the disconnect instructions via the communication module 808. Based on the disconnect instructions, the electricity meter 106 may then open the internal switch 110 and disconnect the load side output powering the premises 108 from the source power line 102. While the communications 810 between the electricity meter 106 and the control center 202 is shown as wireless communications, the communications may be established in various ways, such as via a cellular network, Wi-Fi network, cable network, landline telephone network, and the like.

As shown with the dotted lines, the load control switch may be placed between the electricity meter 116 and the premises 108. In response to receiving the status of the power line frequency 116 falling below the disconnect threshold frequency from the electricity meter 106, the control center 202 may send to the electricity meter 106 disconnect load control instructions to control the load control switch 204. Based on the disconnect load control instructions, the electricity meter 106 may send instruction, as shown by arrow 812, to the load control switch 204 to disconnect one or more switches of the load control switch 204. For example, a first switch of the load control switch 204 may be connected to an HVAC system of the premises 108 and draws the most current, a second switch of the load control switch 204 may be connected to a washer and a dryer, and the like. The disconnect load control instructions from the control center 202 may specify which switch(es) of the load control switch 204 to disconnect. Alternatively, the control center 202 may send the disconnect load control instructions directly to the load control switch 204 to disconnect one or more switches of the load control switch 204 as shown by arrow 814.

As discussed above with reference to FIG. 2, the load control switch 204 may alternatively be an intelligent load control switch capable of monitoring the voltage frequency 116 and controlling one or more switches of the load control switch 204 based on the voltage frequency 116. The intelligent load control switch may be configured with different disconnect and reconnect threshold frequencies and different shut-off and reconnect test time intervals for each circuit that one or more switches of the intelligent load control switch controls. These configurations for the intelligent load control switch may be remotely set or changed by the control center 202 anytime.

Upon determining that the power line frequency 116 has increased above the reconnect threshold frequency at block 312, the electricity meter 106 may notify the control center 202 via the communication module 808 that the power line frequency 116 has increased above the reconnect threshold frequency. In response, the control center 202 may send to the electricity meter 106 reconnect instructions, and the electricity meter 106 may receive the reconnect instructions via the communication module 808. The electricity meter 106 may then close the internal switch 110 based on the reconnect instruction.

If the electricity meter 106 were connected to the premises 108 through the load control switch 204, the control center 202 may send to the electricity meter 106 reconnect load control instructions in response to receiving the status of the power line frequency 116 rising above the reconnect threshold frequency from the electricity meter 106. Upon receiving the reconnect load control instructions via the communication module 708, the electricity meter 106 may reconnect one or more switches of the load control switch 204 based on the reconnect load control instructions. The reconnect load control instructions may specify which switch(es) of the load control switch 204 to reconnect. Alternatively, the control center 202 may send the reconnect load control instructions directly to the load control switch 204 to reconnect one or more switches of the load control switch 204.

Additionally, or alternatively, the electricity meter 106 may set a maximum output load for the electricity meter 106 upon determining that the power line frequency 116 is lower than, or equal to, the disconnect threshold frequency. The maximum output load may be preselected to be lower than a normal output load when the power line frequency is above the disconnect threshold frequency. When the electricity meter 106, by the metrology module 706, determines that the maximum output load is exceeded, the electricity meter 106 may open the internal switch 110 and disconnect the load side output powering the premises 108 from the source power line 102. After the electricity meter 106 opens the internal switch 110, the electricity meter 106 may wait for a predetermined shut-off time interval, for example, for 60 seconds, close the internal switch 110 for a predetermined reconnect test time interval, and determine whether the maximum load is exceeded during the predetermined reconnect test time interval. In response to determining that the maximum load is not exceeded during the predetermined reconnect test time interval, the electricity meter 106 may keep the internal switch closed and maintain the reconnection of the load side output to the source power line 102. However, if the electricity meter 106 determines that the maximum load is exceeded during the predetermined reconnect test time interval, the electricity meter 106 opens the internal switch 110 and disconnects the load side output.

Some or all operations of the methods described above can be performed by execution of computer-readable instructions stored on a computer-readable storage medium, as defined below. The terms "computer-readable medium," "computer-readable instructions," and "computer executable instruction" as used in the description and claims, include routines, applications, application modules, program modules, programs, components, data structures, algorithms, and the like. Computer-readable and-executable instructions can be implemented on various system configurations, including single-processor or multiprocessor systems, minicomputers, mainframe computers, personal computers, hand-held computing devices, microprocessor-based, programmable consumer electronics, combinations thereof, and the like.

The computer-readable storage media may include volatile memory (such as random-access memory (RAM)) and/or non-volatile memory (such as read-only memory (ROM), flash memory, etc.). The computer-readable storage media may also include additional removable storage and/or non-removable storage including, but not limited to, flash memory, magnetic storage, optical storage, and/or tape storage that may provide non-volatile storage of computer-readable instructions, data structures, program modules, and the like.

A non-transitory computer-readable storage medium is an example of computer-readable media. Computer-readable media includes at least two types of computer-readable media, namely computer-readable storage media and communications media. Computer-readable storage media includes volatile and non-volatile, removable and non-removable media implemented in any process or technology for storage of information such as computer-readable instructions, data structures, program modules, or other data. Computer-readable storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer-readable instructions, data structures, program modules, or other data in a modulated data signal, such as a carrier wave, or other transmission mechanism. As defined herein, computer-readable storage media do not include communication media.

The computer-readable instructions stored on one or more non-transitory computer-readable storage media, when executed by one or more processors, may perform operations described above with reference to FIGS. 1-8. Generally, computer-readable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method performed by a control center communicatively coupled to an electricity meter, the method comprising:
    monitoring a power line frequency of a source power line connected to the electricity meter, the source power line coupled to a load side output of the electricity meter;
    determining the power line frequency;
    in response to determining that the power line frequency is lower than a disconnect threshold frequency:
        setting a maximum output load for the electricity meter, determining whether the maximum output load is exceeded, and
        instructing the electricity meter to disconnect the load side output from the source power line in response to determining that the maximum output load is exceeded; and
    after a predetermined shut-off time interval from a time of disconnecting the load side output from the source power line:
        instructing the electricity meter to reconnect the load side output to the source power line for a predetermined reconnect test time interval,
        determining whether the maximum output load is exceeded during the predetermined reconnect test time interval,
        in response to determining that the maximum output load is not exceeded during the predetermined reconnect test time interval, causing the electricity meter to maintain the reconnection of the load side output to the source power line, and
        in response to determining that the maximum output load is exceeded during the predetermined reconnect test time interval, causing the electricity meter to disconnect the load side output from the source power line.

2. The method of claim 1, wherein the disconnect threshold frequency is one of a plurality of disconnect threshold frequencies.

3. The method of claim 1, wherein determining that the power line frequency is lower than the disconnect threshold frequency comprises:
    determining that the power line frequency has remained lower than the disconnect threshold frequency for a predetermined disconnect time period.

4. The method of claim 1, further comprising:
    instructing the electricity meter to reconnect the load side output to the source power line in response to determining that the power line frequency has remained higher than a reconnect threshold frequency for a predetermined reconnect time period, the reconnect threshold frequency higher than the disconnect threshold frequency.

5. The method of claim 4, wherein instructing the electricity meter to reconnect the load side output to the source power line comprises:
    receiving, from the electricity meter, a notification notifying that the power line frequency has remained higher than the reconnect threshold frequency for the predetermined reconnect time period;
    transmitting, to the electricity meter, reconnect instructions to reconnect the load side output to the source power line; and
    causing the electricity meter to reconnect the load side output to the source power line.

6. The method of claim 1, wherein in response to determining that the power line frequency is lower than the disconnect threshold frequency, instructing the electricity meter to disconnect the load side output from the source power line comprises:
    receiving, from the electricity meter, a notification notifying that the power line frequency is lower than the disconnect threshold frequency;
    transmitting, to the electricity meter, disconnect instructions to disconnect the load side output from the source power line; and
    causing the electricity meter to disconnect the load side output from the source power line.

7. The method of claim 6, wherein the notification notifies the control center that the power line frequency is lower than the disconnect threshold frequency in response to determining that the power line frequency has remained lower than the disconnect threshold frequency for a predetermined disconnect time period.

8. The method of claim 6,
wherein the disconnect instructions comprise instructions to disconnect one or more loads from a load control switch connected to the load side output of the electricity meter, and
wherein causing the electricity meter to disconnect the load side output from the source power line comprises causing the electricity meter to disconnect the one or more loads from the load control switch.

9. A control center comprising:
one or more processors; and
memory communicatively coupled to the one or more processors, the memory storing thereon computer executable instructions that, when executed by the one or more processors, cause the one or more processors to perform operations comprising:
monitoring a power line frequency of a source power line connected to an electricity meter communicatively coupled to the control center, the source power line coupled to a load side output of the electricity meter;
determining the power line frequency;
in response to determining that the power line frequency is lower than a disconnect threshold frequency:
setting a maximum output load for the electricity meter,
determining whether the maximum output load is exceeded, and
causing the electricity meter to disconnect the load side output from the source power line in response to determining that the maximum output load is exceeded; and
after a predetermined shut-off time interval from a time of disconnecting the load side output from the source power line:
causing the electricity meter to reconnect the load side output to the source power line for a predetermined reconnect test time interval,
determining whether the maximum output load is exceeded during the predetermined reconnect test time interval,
in response to determining that the maximum output load is not exceeded during the predetermined reconnect test time interval, causing the electricity meter to maintain the reconnection of the load side output to the source power line, and
in response to determining that the maximum output load is exceeded during the predetermined reconnect test time interval, causing the electricity meter to disconnect the load side output from the source power line.

10. The control center of claim 9, wherein the operations further comprise:
causing the electricity meter to reconnect the load side output to the source power line in response to determining that the power line frequency has remained higher than a reconnect threshold frequency for a predetermined reconnect time period, the reconnect threshold frequency higher than the disconnect threshold frequency.

11. The control center of claim 10, wherein causing the electricity meter to reconnect the load side output to the source power line comprises:
receiving, from the electricity meter, a notification notifying that the power line frequency has remained higher than the reconnect threshold frequency for the predetermined reconnect time period;
transmitting, to the electricity meter, reconnect instructions to reconnect the load side output to the source power line; and
causing the electricity meter to reconnect the load side output to the source power line.

12. The control center of claim 9, wherein in response to determining that the power line frequency is lower than the disconnect threshold frequency, causing the electricity meter to disconnect the load side output from the source power line comprises:
receiving, from the electricity meter, a notification notifying that the power line frequency is lower than the disconnect threshold frequency;
transmitting, to the electricity meter, disconnect instructions to disconnect the load side output from the source power line; and
causing the electricity meter to disconnect the load side output from the source power line.

13. The control center of claim 12, wherein the notification notifies the control center that the power line frequency is lower than the disconnect threshold frequency is based at least in part on determining that the power line frequency has remained lower than the disconnect threshold frequency for a predetermined disconnect time period.

14. The control center of claim 12, wherein:
the disconnect instructions comprise instructions to disconnect one or more loads from a load control switch connected to the load side output of the electricity meter, and
causing the electricity meter to disconnect the load side output from the source power line comprises causing the electricity meter to disconnect the one or more loads from the load control switch.

15. A non-transitory computer-readable storage medium storing thereon computer executable instructions that, when executed by one or more processors of a control center coupled to an electricity meter, cause the one or more processors to perform operations comprising:
monitoring a power line frequency of a source power line connected to an electricity meter communicatively coupled to the control center, the source power line coupled to a load side output of the electricity meter;
determining the power line frequency;
in response to determining that the power line frequency is lower than a disconnect threshold frequency:
setting a maximum output load for the electricity meter,
determining whether the maximum output load is exceeded, and
causing the electricity meter to disconnect the load side output from the source power line in response to determining that the maximum output load is exceeded; and
after a predetermined shut-off time interval from a time of disconnecting the load side output from the source power line:
causing the electricity meter to reconnect the load side output to the source power line for a predetermined reconnect test time interval, determining whether the maximum output load is exceeded during the predetermined reconnect test time interval, in response to determining that the maximum output load is not exceeded during the predetermined reconnect test time interval, causing the electricity meter to maintain the reconnection of the load side output to the source power line, and in response to determining that the maximum output load is exceeded during the predetermined reconnect test time interval, causing the electricity meter to disconnect the load side output from the source power line.

16. The non-transitory computer-readable storage medium of claim 15, wherein the operations further comprise:

causing the electricity meter to reconnect the load side output to the source power line in response to determining that the power line frequency has remained higher than a reconnect threshold frequency for a predetermined reconnect time period, the reconnect threshold frequency higher than the disconnect threshold frequency.

17. The non-transitory computer-readable storage medium of claim 16, wherein causing the electricity meter to reconnect the load side output to the source power line comprises:

receiving, from the electricity meter, a notification notifying that the power line frequency has remained higher than the reconnect threshold frequency for the predetermined reconnect time period;

transmitting, to the electricity meter, reconnect instructions to reconnect the load side output to the source power line; and causing the electricity meter to reconnect the load side output to the source power line.

18. The non-transitory computer-readable storage medium of claim 15, wherein in response to determining that the power line frequency is lower than the disconnect threshold frequency, causing the electricity meter to disconnect the load side output from the source power line comprises:

receiving, from the electricity meter, a notification notifying that the power line frequency is lower than the disconnect threshold frequency;

transmitting, to the electricity meter, disconnect instructions to disconnect the load side output from the source power line; and causing the electricity meter to disconnect the load side output from the source power line.

19. The non-transitory computer-readable storage medium of claim 18, wherein the notification notifies the control center that the power line frequency is lower than the disconnect threshold frequency based at least in part on determining that the power line frequency has remained lower than the disconnect threshold frequency for a predetermined disconnect time period.

20. The non-transitory computer-readable storage medium of claim 18, wherein:

the disconnect instructions comprise instructions to disconnect one or more loads from a load control switch connected to the load side output of the electricity meter, and causing the electricity meter to disconnect the load side output from the source power line comprises causing the electricity meter to disconnect the one or more loads from the load control switch.

\* \* \* \* \*